(12) United States Patent
Dang et al.

(10) Patent No.: US 7,863,587 B2
(45) Date of Patent: Jan. 4, 2011

(54) SYMMETRICAL SHAPER FOR AN ION BEAM DEPOSITION AND ETCHING APPARATUS

(75) Inventors: Peter M. Dang, San Jose, CA (US); Jorge A. Goitia, San Jose, CA (US); Cherngye Hwang, San Jose, CA (US); Eduardo T. Mireles, Guadalajara (MX)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 234 days.

(21) Appl. No.: 11/701,037

(22) Filed: Jan. 31, 2007

(65) Prior Publication Data

US 2008/0179535 A1    Jul. 31, 2008

(51) Int. Cl.
| | |
|---|---|
| H01J 3/14 | (2006.01) |
| H01J 3/26 | (2006.01) |
| A61N 5/00 | (2006.01) |
| G21G 5/00 | (2006.01) |
| G21K 1/08 | (2006.01) |

(52) U.S. Cl. .............................. 250/492.3; 250/396 R; 250/492.21; 250/492.22

(58) Field of Classification Search ............. 250/503.1, 250/396 R, 423 R, 398, 492.1, 492.22, 492.3; 430/4, 5; 216/66, 94
See application file for complete search history.

(56) References Cited

U.S. PATENT DOCUMENTS

| | | | |
|---|---|---|---|
| 3,904,503 A | 9/1975 | Hanfmann | |
| 4,758,304 A | 7/1988 | McNeil et al. | |
| 4,834,021 A | 5/1989 | Opresko et al. | |
| 6,063,436 A | 5/2000 | Pavell et al. | |
| 6,197,164 B1 | 3/2001 | Pinarbasi | |
| 6,419,803 B1 | 7/2002 | Baldwin et al. | |
| 6,447,653 B1 | 9/2002 | Debley et al. | |
| 6,547,939 B2 * | 4/2003 | Hsueh et al. ........... | 204/298.03 |
| 6,663,747 B2 | 12/2003 | Garcia et al. | |
| 6,780,341 B2 | 8/2004 | Garcia et al. | |
| 2003/0129325 A1 | 7/2003 | Kandaka | |

FOREIGN PATENT DOCUMENTS

| | | |
|---|---|---|
| GB | 1290863 | 9/1972 |
| JP | 5140728 | 6/1993 |
| JP | 8181072 | 7/1996 |

OTHER PUBLICATIONS

Gnanarajan, "Using Masks to Obtain Uniform Ion Etch Rates", *Review of Scientific Instruments*, vol. 73, No. 4, (Apr. 2002),1853-1855.

* cited by examiner

*Primary Examiner*—Jack I Berman
*Assistant Examiner*—Brooke Purinton

(57) ABSTRACT

A shaper for shaping an ion beam and that can be used for both deposition and etching is described. The shaper includes a plate that is placed between an ion beam grid and an ion beam source. The plate covers holes in the grid, and is shaped and dimensioned such that the plate does not partially cover any holes in the grid that are directly adjacent to the plate. A hole is configured to mount the shaper at a center of the grid and at least one other hole is configured to secure the shaper to the grid to prevent the shaper from rotating relative to the grid. A center mount portion covers holes in the grid. The plate has two axes of reflection symmetry. The uniformity of both deposition and etching is improved.

20 Claims, 4 Drawing Sheets

SYMMETRICAL SHAPER FOR AN ION BEAM DEPOSITION AND ETCHING APPARATUS

TECHNICAL FIELD

This invention relates generally to the field of deposition and etching processes and devices that use ion beams.

BACKGROUND

Direct access storage devices (DASDs) have become part of everyday life, and as such, the capability to manipulate and store larger amounts of data at greater speeds is expected. To meet these expectations, DASDs such as hard disk drives (HDDs) have undergone many changes.

The basic hard disk drive model resembles a phonograph. That is, the hard disk drive model includes a storage disk, or hard disk, that spins at a standard rotational speed. An actuator arm with a suspended slider is utilized to reach out over the disk. The arm carries a head assembly that has a magnetic read/write transducer, or head, for writing or reading information to or from a location on the disk. An air bearing surface (ABS) on the slider allows the slider to be flown very close to the surface of a disk. The complete head assembly, e.g., the suspension and head, is called a head gimbal assembly (HGA).

Data is recorded onto the surface of a disk in a pattern of concentric rings known as data tracks. One way to increase the amount of data that can be stored on a disk is to make each data track narrower so that the tracks can be placed closer together. But, as tracks are narrowed, the signal-to-noise ratio is worsened, making it more difficult to discern signals from the head. Signal-to-noise ratio can be improved by positioning the head closer to the disk surface. Thus, the height of the slider above the disk (referred to as fly height) can be an important parameter. Another important parameter is the distance between the bottom surface of the head and the bottom surface of the substrate to which the head is attached (referred to as pole tip recession). In general, as the spacing between the head and the disk surface is narrowed, it becomes more important to tightly control the flatness and uniformity of surfaces such as the ABS, in order to reduce the probability of contact between the head and a disk.

Ion milling is a popular technique for forming the ABS on a slider. However, with distances and tolerances measured in terms of nanometers, even minute deviations in the topography of a surface can be very significant. In order to achieve the desired surface uniformity, conventional ion milling techniques need to be improved beyond their current capabilities.

SUMMARY

A shaper for shaping an ion beam is described. The shaper can be used for both deposition and etching. The shaper includes a plate that is placed between an ion beam grid and an ion beam source. The plate covers holes in the grid, and is shaped and dimensioned such that the plate does not partially cover any holes in the grid that are directly adjacent to the plate. A hole is configured to mount the shaper at a center of the grid and at least one other hole is configured to secure the shaper to the grid to prevent the shaper from rotating relative to the grid. A center mount portion covers holes in the grid. The plate has two axes of reflection symmetry. The uniformity of both deposition and etching is improved.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, and components have not been described in detail as not to unnecessarily obscure aspects of the present invention.

Figure 1:
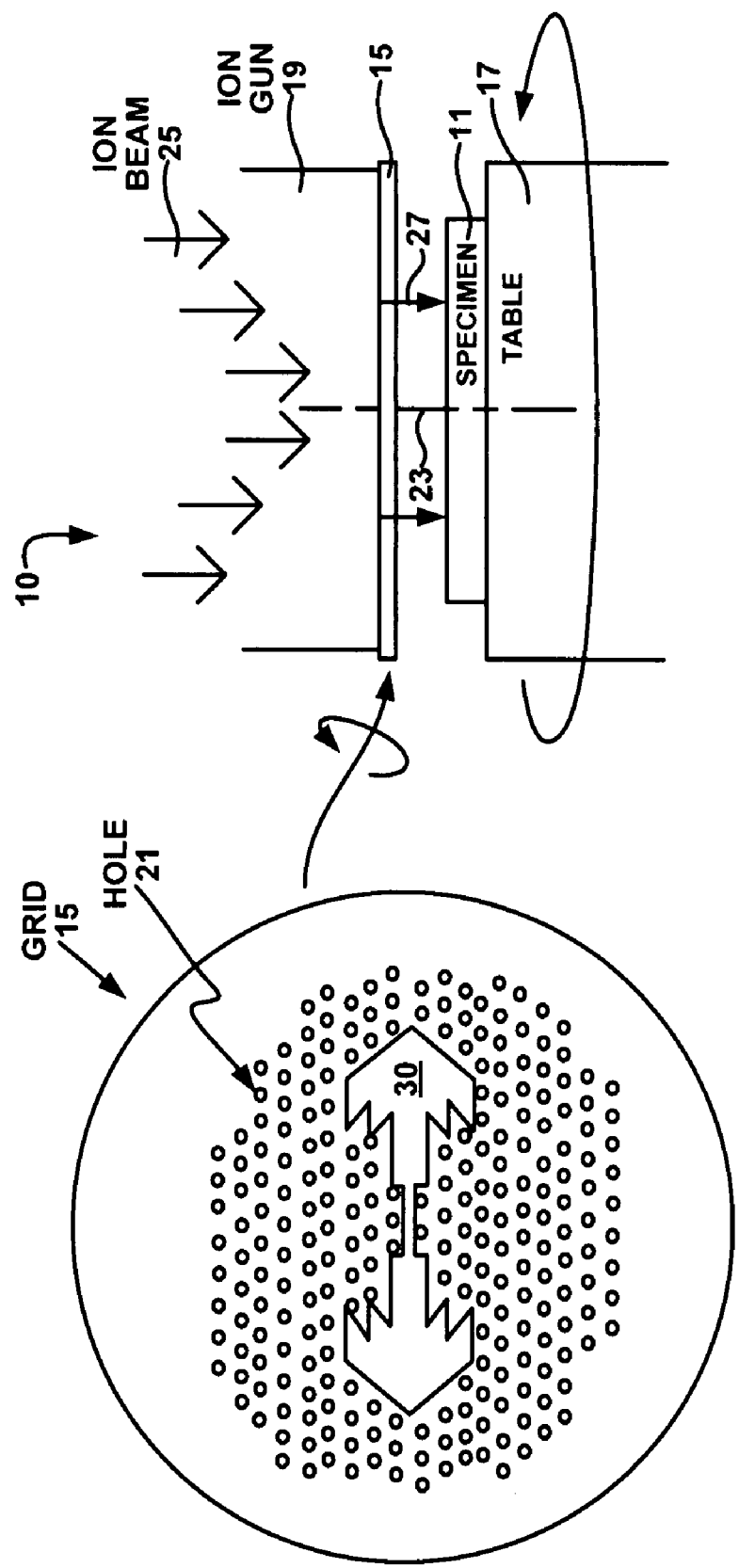
FIG. 1 illustrates an example of an ion beam deposition and etching apparatus that utilizes an ion beam shaper in accordance with embodiments of the present invention.

FIG. 1 illustrates an example of an ion beam deposition and etching apparatus 10 that utilizes an ion beam shaper 30 in accordance with embodiments of the present invention. FIG. 1 is not to scale. In the example of FIG. 1, the apparatus 10 includes a grid 15 that is mounted on an ion beam gun, or source, 19. FIG. 1 includes a side view showing grid 15 installed in apparatus 10, and a top view showing an enlarged version of grid 15 (as if grid 15 had been removed from apparatus 10 and rotated for ease of viewing).

A specimen 11 is mounted on a table 17 such that the center 23 of the grid 15, the table 17 and the specimen 11 are aligned. Although not shown in FIG. 1, the specimen 11 and the grid 15 may be mounted at an angle relative to one another. That is, the specimen 11 and grid 15 are not necessarily parallel to each other, and therefore the ion beam's angle of incidence may not be perpendicular to the specimen 11.

The table 17 and/or the grid 15 can be rotated—in general, the specimen 11 and the grid 15 can be rotated relative to one another.

Grid 15 includes a large number of holes, exemplified by hole 21. Grid 15 may also include regions (other than the regions between adjacent holes) that are free of holes. Although not shown in FIG. 1, the holes 21 extend to the periphery of grid 15.

As specimen 11 is rotated relative to the grid 15, ion beam source 19 emits an ion beam 25 onto the surface of grid 15. The beam 25 is filtered by grid 15, and relatively small ion "beamlets" 27 are emitted from the grid 15. Using techniques known in the art and so not described in detail herein, the beamlets 27 can be used to deposit material onto specimen 11 or to etch material from specimen 11.

It is desirable that ion beam density be uniform across the surface of the specimen 11, so that material is deposited uniformly across the specimen's surface or so that etching is uniform across the specimen's surface. To achieve such uniformity, a shaper 30 is mounted onto either the upper or lower surface of grid 15. In one embodiment, the ion beam source 19 includes a plasma chamber and a set of beam grids. In such an embodiment, the shaper 30 is mounted on the innermost grid (the grid closest to the plasma chamber).

Again, FIG. 1 is not to scale. In actuality, the surface area of shaper 30 is relatively small compared to the surface of grid 15. For example, shaper 30 may cover less than about five (5) percent of the grid 15.

According to embodiments of the present invention, the shaper 30 is dimensioned and shaped such that it does not partially cover any of the holes 21. That is, in one embodiment, each of the holes 21 in grid 15 is either completely closed by shaper 30 or is completely exposed to an incident ion beam.

In operation, as the specimen 11 is rotated beneath the source 19 and grid 15, ion beamlets 27 that are not blocked by shaper 30 are able to reach specimen 11. Empirical results demonstrate that, with the use of shaper 30, deposition and etching are uniform across the entire radius of specimen 11 (see FIG. 4). Significantly, shaper 30 can be used for both deposition and etching and achieves uniform results for both.

Figure 2:
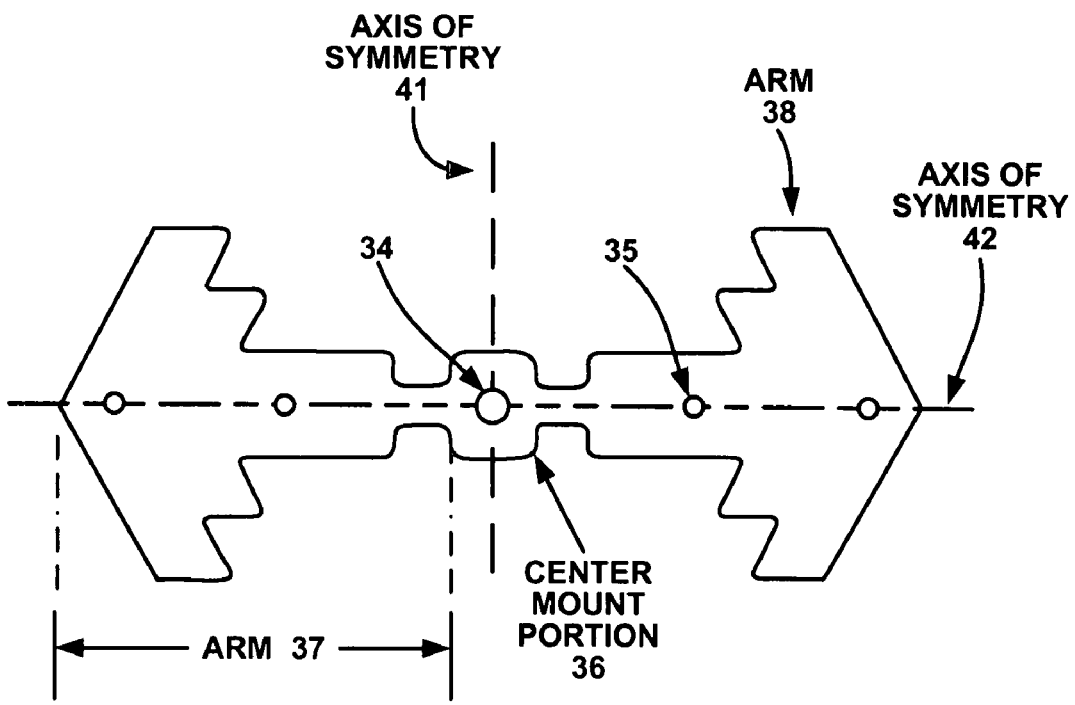
FIGS. 2 and 3 illustrate an ion beam shaper according to one embodiment of the present invention.
Figure 3:
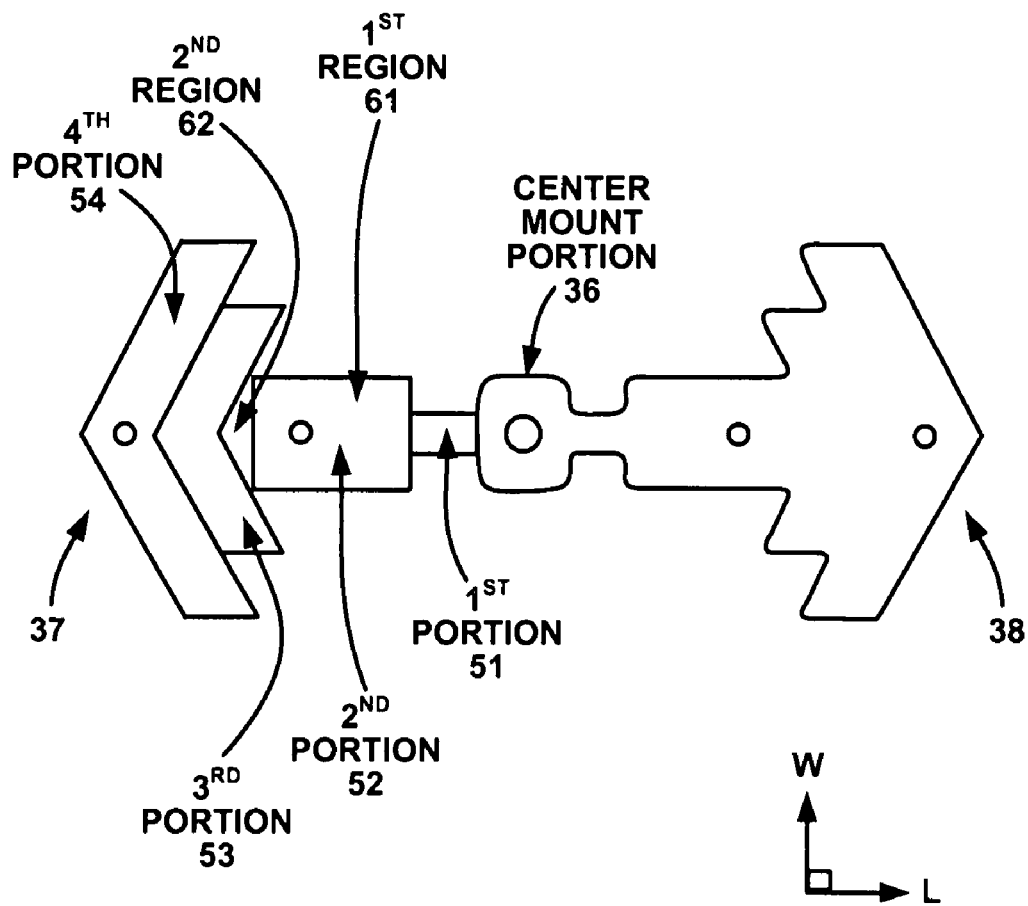

FIGS. 2 and 3 illustrate ion beam shaper 30 according to one embodiment of the present invention. Shaper 30 is essentially a relatively thin and flat plate formed from a durable material such as molybdenum. In one embodiment, shaper 30 and grid 15 are made of the same material.

With reference to FIG. 2, shaper 30 has reflective (bilateral, mirror) symmetry about a first axis 41 and also has reflective symmetry about a second axis 42 that is perpendicular to the first axis. In the present embodiment, shaper 30 includes a hole 34 that is used to mount the shaper at the center of the grid 15 of FIG. 1 (the hole 34 is aligned with the center of the grid 15 and a screw or other type of fastening mechanism is inserted through hole 34 into grid 15). In a similar manner, other holes, such as hole 35, can be used to secure shaper 30 to grid 15 and to prevent the shaper from rotating relative to the grid.

A first arm 37, measured from the center mount portion 36, extends radially in one direction (R1) while a second arm 38, also measured from the center mount portion 36, extends radially in the opposite direction (R2). In one embodiment, each of the arms 37 and 38 covers 53 holes in grid 15 (FIG. 1). Additional holes are covered by the center mount portion 36.

As shown in FIG. 3, each of the arms 37 and 38 of shaper 30 includes a first portion 51 that is substantially rectilinear in shape. Each arm 37 and 38 also includes a second portion 52 that is wider (W) and longer (L) than first portion 51. The second portion 52 includes a first region 61 that is substantially rectilinear in shape, and a second region 62 that tapers, forming essentially a triangular shape. Each arm 37 and 38 also includes a third portion 53 that is wider than the second portion 52, and is essentially chevron-shaped (V-shaped). Each arm 37 and 38 also includes a fourth portion 54 that is wider than the third portion 53, and that is also essentially chevron-shaped. In general, the width of shaper 30 increases in the radial or lengthwise direction. In one embodiment, shaper 30 has an overall length of about 5 inches and a maximum width of about two (2) inches.

With reference again to FIG. 1, before passing through grid 15, some portions of the ion beam 25 will have a greater density of ions than other portions of the beam. The shaper 30 blocks the higher density portions of the beam 25, such that the ion beamlets 27 that reach the specimen 11 are more uniform and thus will produce a more uniform deposition or etch pattern on the surface of the specimen. Because shaper 30 blocks the higher density portions of the ion beam, the overall intensity of the ion beam is reduced, which may result in reduced deposit and etch rates. However, the reduction in these rates is balanced by the advantages that come with improved uniformity. For example, when applied to the fabrication of hard disk drives (HDDs)—specifically, to the fabrication of the air bearing surface (ABS) of a slider—the improved uniformity results in improved ABS topography after deposition and etch, thus allowing the read/write head to be situated closer to the surface of a storage disk without increasing the probability of contact between the head and the disk surface.

Figure 4:
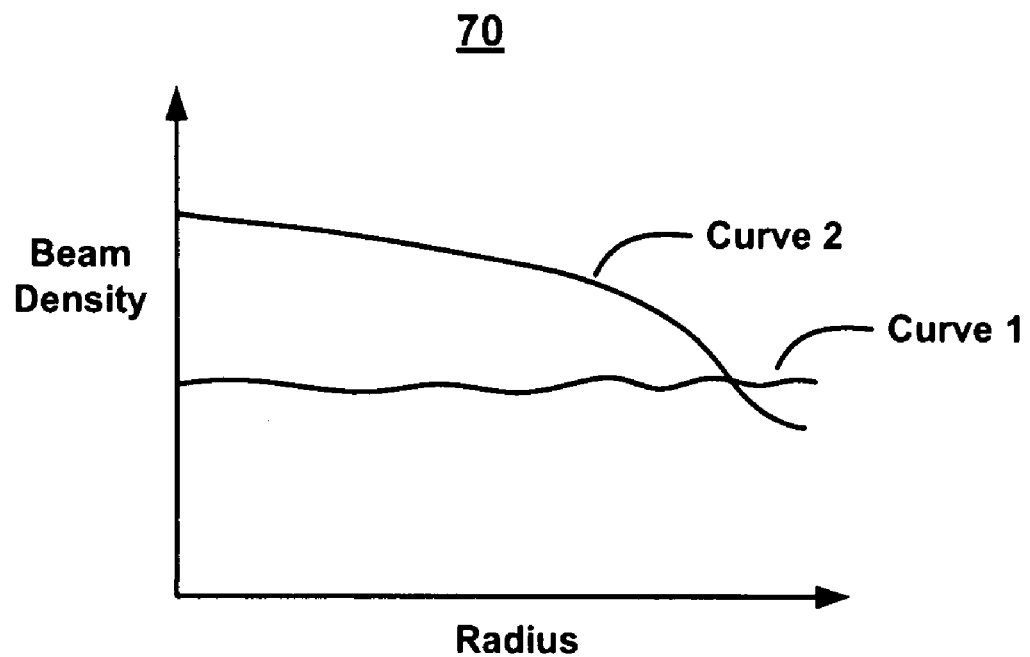
FIG. 4 is a graph illustrating ion beam density versus radius according to an embodiment of the present invention.

FIG. 4 is a graph 70 illustrating ion beam density versus radius (e.g., a radius along the surface of a specimen). Curve 1 shows that, using shaper 30 of FIGS. 1-3, the beam density is relatively flat across the surface of a specimen. Significantly, even at the periphery of a specimen, the beam density remains relatively flat, for both deposition and etch. In contrast, as represented by curve 2, beam density is significantly diminished at the periphery of a specimen when a conventional etch or deposition technique is used.

Because the beam density remains relatively flat across the surface of a specimen, the amount of material deposited or removed during deposition and etching will be uniform across the surface of the specimen. Indeed, empirical data demonstrates that uniform deposition and etching across the surface of a specimen is realized using shaper 30, over a wide range of operating parameters including beam density, mounting angle (the angle between the specimen and the beam), and beam power, voltage or current. Notably, with shaper 30, both uniform deposition and uniform etching are achieved over the range of operating parameters. Thus, the shaper 30 does not have to be removed and replaced with a different shaper between deposition and etching.

In summary, embodiments in accordance with the present invention pertain to an ion beam shaper that can be used during both deposition and etch, and that can improve both deposition and etch uniformity across the entire surface of a specimen. Thus, elements such as the air bearing surface of a slider in an HDD can be made to finer tolerances, which in turn allows a read/write head to be located closer to the surface of a disk, reducing signal-to-noise ratio and allowing more information to be stored on the disk.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A shaper for shaping an ion beam, said shaper comprising:

a plate that is placed between an ion beam grid and an ion beam source, said plate for covering holes in said grid, and wherein said plate is shaped and dimensioned such that said plate does not partially cover any holes in said grid that are directly adjacent to said plate;

a hole that is configured to mount said shaper at a center of said grid and at least one other hole that is configured to secure said shaper to said grid to prevent said shaper from rotating relative to said grid; and a center mount portion, said center mount portion covering holes in said grid;

wherein said shaper has two axes of reflection symmetry.

2. The shaper of claim 1 wherein the width of said plate increases with radius.

3. The shaper of claim 1 having a first arm extending radially in a first direction from said center mount portion and a second arm extending radially from said center mount portion in a second direction opposite said first direction, each of said first and second arms having a first portion that has a first width, a second portion that has a second width greater than said first width, a third portion that has a third width that is greater than said second width, and a fourth portion that has a fourth width that is greater than said third width.

4. The shaper of claim 3 wherein said first portion is rectilinear, wherein said second portion comprises a rectilinear first region and a second region that tapers from said second width, and wherein said third and fourth portions are each chevron-shaped.

5. The shaper of claim 3 wherein said first and second arms cover 53 holes each.

6. The shaper of claim 1 wherein said plate does not partially cover any of said holes.

7. The shaper of claim 1 wherein said plate is usable for both etching and deposition.

8. An ion beam deposition and etching apparatus, said apparatus comprising:

an ion beam source for emitting an ion beam toward a specimen;

an ion beam grid mounted between said ion beam source and said specimen; and a shaper comprising a plate that is placed between said grid and said ion beam source, said plate covering holes in said grid, a hole that is configured to mount said shaper at a center of said grid and at least one other hole that is configured to secure said shaper to said grid to prevent said shaper from rotating relative to said grid, and a center mount portion, said center mount portion covering holes in said grid, wherein said shaper has a first axis of reflection symmetry and a second axis of reflection symmetry that is perpendicular to said first axis, and wherein said plate is shaped and dimensioned such that said plate does not partially cover any holes in said grid that are directly adjacent to said plate.

9. The apparatus of claim 8 wherein the width of said plate increases with distance along said first axis.

10. The apparatus of claim 8 wherein said shaper comprises a first arm extending radially in a first direction from said center mount portion and a second arm extending radially from said center mount portion in a second direction opposite said first direction, each of said first and second arms having a first portion that has a first width, a second portion that has a second width greater than said first width, a third portion that has a third width that is greater than said second width, and a fourth portion that has a fourth width that is greater than said third width.

11. The apparatus of claim 10 wherein said first portion is rectilinear, wherein said second portion comprises a rectilinear first region and a second region that tapers from said second width, and wherein said third and fourth portions are each V-shaped.

12. The apparatus of claim 10 wherein said first and second arms cover 53 holes each.

13. The apparatus of claim 8 wherein said plate does not partially cover any of said holes.

14. The apparatus of claim 8 wherein said plate is affixed to said grid, and wherein said specimen is rotated relative to said plate and grid.

15. A deposition and etching apparatus, said apparatus comprising:

means for emitting an ion beam toward a specimen;

means for filtering said ion beam before said ion beam reaches said specimen; and means for blocking a portion of said ion beam before said ion beam reaches said specimen, a hole that is configured to mount said means for blocking at a center of said means for filtering and at least one other hole that is configured to secure said means for blocking to said means for filtering to prevent said means for blocking from rotating relative to said means for filtering, and a center mount portion, said center mount portion covering holes in said means for filtering, wherein said means for blocking has a shape that is bilaterally symmetrical along a first axis and bilaterally symmetrical about a second axis that is perpendicular to said first axis and is shaped and dimensioned such that said means for blocking does not partially cover any holes in said means for filtering that are directly adjacent to said means for blocking.

16. The apparatus of claim 15 said means for filtering includes a pattern of holes formed therein, wherein a portion of said holes is blocked by said means for blocking, wherein the number of blocked holes increases with distance along said first axis.

17. The apparatus of claim 16 wherein said means for blocking does not partially cover any of said holes.

18. The apparatus of claim 15 wherein said shape comprises a first portion that has a first width, a second portion that has a second width greater than said first width, a third portion that has a third width that is greater than said second width, and a fourth portion that has a fourth width that is greater than said third width.

19. The apparatus of claim 18 wherein said first portion is rectilinear, wherein said second portion comprises a rectilinear first region and a second region that tapers from said second width, and wherein said third and fourth portions are each chevron-shaped.

20. The apparatus of claim 15 wherein said specimen is rotated relative to said means for filtering and said means for blocking.

\* \* \* \* \*